United States Patent
Wu et al.

(10) Patent No.: US 11,258,252 B2
(45) Date of Patent: Feb. 22, 2022

(54) ON-CHIP SURGE PROTECTION CIRCUIT

(71) Applicant: ECONET (HK) LIMITED

(72) Inventors: Cheng-Hsu Wu, Hsinchu County (TW); Cheng-Chieh Hsu, Hsinchu County (TW); Che-Yuan Jao, Hsinchu County (TW); Hung-Wei Chen, Hsinchu County (TW); Tsung-Hsien Hsieh, Hsinchu County (TW)

(73) Assignee: ECONET (HK) LIMITED, Hong Kong (CN)

( * ) Notice: Subject to any disclaimer, the term of this patent is extended or adjusted under 35 U.S.C. 154(b) by 0 days.

(21) Appl. No.: 16/777,979

(22) Filed: Jan. 31, 2020

(65) Prior Publication Data
US 2021/0159693 A1   May 27, 2021

(30) Foreign Application Priority Data
Nov. 27, 2019   (TW) .................................. 108143075

(51) Int. Cl.
*H02H 9/04*   (2006.01)

(52) U.S. Cl.
CPC .................................... *H02H 9/04* (2013.01)

(58) Field of Classification Search
CPC ....................................................... H02H 9/04
USPC ......................................................... 361/56
See application file for complete search history.

(56) References Cited

U.S. PATENT DOCUMENTS

2015/0262994 A1*   9/2015   Hsu ..................... H01L 27/0248
361/56

FOREIGN PATENT DOCUMENTS

TW   201125251 A   7/2011

* cited by examiner

*Primary Examiner* — Dharti H Patel
(74) *Attorney, Agent, or Firm* — Bacon & Thomas, PLLC

(57) ABSTRACT

The present invention provides an on-chip surge protection circuit, including a low voltage rail, a negative transmitter differential output, a positive transmitter differential output, and a surge protection component. The surge protection component includes a first end, a second end, and a control end. The first end is connected to the transmitter differential output N. The second end is connected to the transmitter differential output P. The control end is connected to the low voltage rail.

20 Claims, 17 Drawing Sheets

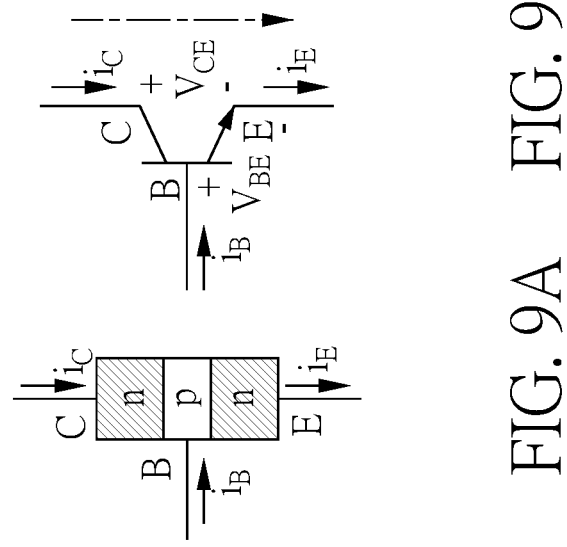
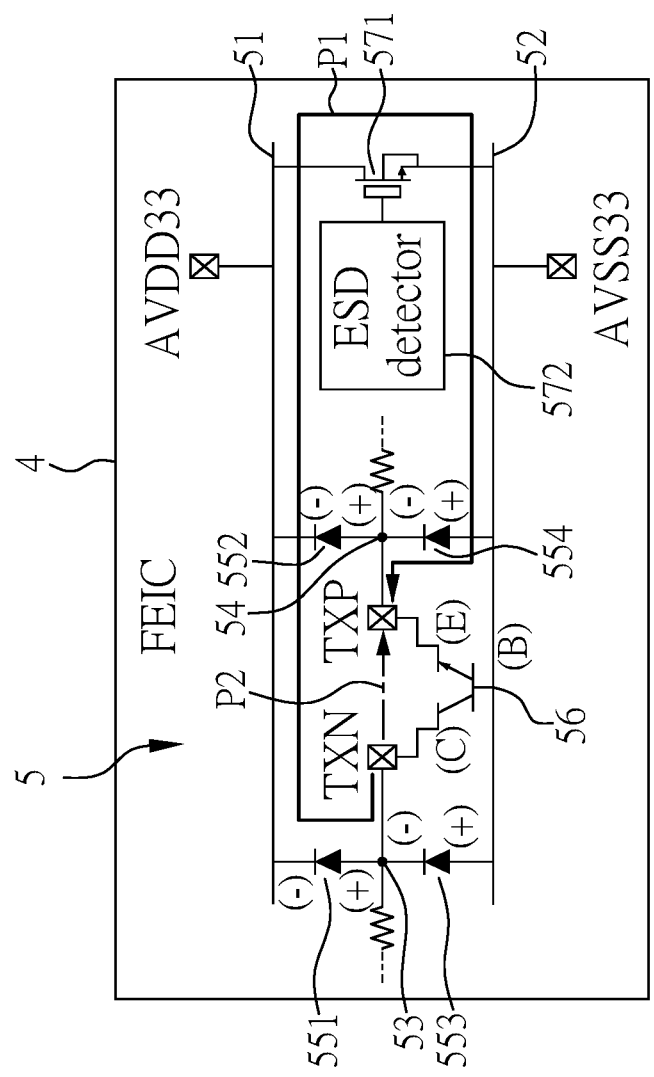
FIG. 8  FIG. 9A  FIG. 9B

ON-CHIP SURGE PROTECTION CIRCUIT

CROSS REFERENCE TO RELATED APPLICATION

This application claims the benefits of the Taiwan Patent Application Serial Number 108143075, filed on Nov. 27, 2019, the subject matter of which is incorporated herein by reference.

BACKGROUND OF THE INVENTION

1. Field of the Invention

The present invention relates to a surge protection circuit, and in particular, to a surge protection circuit integrated on a chip.

2. Description of Related Art

A surge refers to an instant overcurrent or overvoltage occurring in an electronic circuit, and it may cause the damage of the electronic circuit.

FIG. 1 shows several causes of a surge event.

The surge event may come from: (1A) a direct lightning stroke that falls on an outdoor external circuit such as a power distributor 11; (1B) an indirect lightning stroke that impacts on a cloud network or generates an interfering electromagnetic field 12; or (1C) discharge coupling energy close to a direct ground 13.

FIG. 2 shows an equivalent circuit diagram of an electronic device 2 using an "on-board" surge protection unit 26.

The electronic device 2 typically includes a primary-side transformer 21, a secondary-side transformer 22, and a chip 23. The chip 23 may be a front-end integrated circuit (FEIC) chip. A transmitter output (TX) of the chip 23 includes a negative end (−) and a positive end (+). In FIG. 2, a surge 24 is coupled from the primary-side transformer 21 to the secondary-side transformer 22, and induces an overcurrent 25 in the secondary-side transformer 22, which flows through the transmitter output of the chip 23.

To deal with the surge, a known solution is to use the "on-board" surge protection unit 26 to drain (or remove) the overcurrent away into the ground. The surge protection unit 26 may include an external resistance 261 and/or a surge protector 262 such as a transient voltage suppressor (TVS), a Zener diode, a thyristor, a surge suppressor, and so on. However, it should be noted that, the surge protection unit 26 is arranged "on-board", but outside the chip 23, so it needs additional components, requires additional designs, and occupies additional areas on the circuit board.

Therefore, it is desirable to provide a novel surge protection circuit to solve the aforementioned problem.

SUMMARY OF THE INVENTION

The present invention aims to provide an "on-chip" surge protection circuit to realize the following primary purpose(s): (1-1) draining the overcurrent induced by the surge away; (1-2) removing (or omitting) the surge protection unit outside the chip, for example, removing the external resistance in FIG. 2 (i.e. the external resistance 261 is set to be 0 ohm ($\Omega$)) and/or removing the external surge protector in FIG. 2; (1-3) integrating the surge protection circuit into the internal of the chip; and/or (1-4) realizing chip's automatic self-protection mechanism to deal with the surge.

Preferably, the on-chip surge protection circuit of the present invention also aims to realize the following secondary purpose(s): (2-1) removing (or omitting) the surge detector; (2-2) removing (or omitting) the additional triggering circuit used to control the surge protector; (2-3) reducing the area occupied by the surge protection circuit; and/or (2-4) reducing the complexity of the surge protection circuit. The aforementioned purposes are "chip-level" topics.

Further preferably, the on-chip surge protection circuit of the present invention also aims to realize the following tertiary purpose: providing the chip that satisfies the surge pass specification, wherein the chip can withstand (or endure) a (differential) surge of 1 kV and maintain a normal work when the surge passes through the chip's transmitter output pins.

According to one aspect of the present invention, there is provided an on-chip surge protection circuit including a low voltage rail, a negative transmitter differential output, a positive transmitter differential output, and a surge protection component. The surge protection component includes a first end, a second end, and a control end. The first end is connected to the negative transmitter differential output. The second end is connected to the positive transmitter differential output. The control end is connected to the low voltage rail.

Optionally, or preferably, the surge protection component is integrated inside a chip.

Optionally, or preferably, a surge induces a negative differential surge voltage at the negative transmitter differential output, and induces a positive differential surge voltage at the positive transmitter differential output. The surge protection component is configured to be turned on according to the negative differential surge voltage, the positive differential surge voltage, and the low voltage rail's voltage.

Optionally, or preferably, the surge protection component is configured to be turned off when there is no surge or the surge disappears.

Optionally, or preferably, the low voltage rail's voltage serves as a surge control signal for the surge protection component.

Optionally, or preferably, the surge protection component forms a bypass path between the negative transmitter differential output and the positive transmitter differential output to drain surge current away.

Optionally, or preferably, the bypass path is a bidirectional path for the surge current to flow from the negative transmitter differential output to the positive transmitter differential output, or to flow from the positive transmitter differential output to the negative transmitter differential output, depending on the negative differential surge voltage and the positive differential surge voltage.

Optionally, or preferably, the surge protection component is a bipolar junction transistor (BJT), a silicon controlled rectifier (SCR), a field oxide device (FOD), or a metal-oxide-semiconductor (MOS) field effect transistor.

Optionally, or preferably, the surge protection component is a parasitic component.

Optionally, or preferably, the surge protection component is formed of an oxide diffusion diode structure or a well diode structure.

Optionally, or preferably, the on-chip surge protection circuit further includes a first pull-up component, a second pull-up component, a first pull-down component, and a second pull-down component. The first pull-up component is arranged between a high rail and the negative transmitter differential output. The second pull-up component is arranged between the high voltage rail and the positive transmitter differential output. The first pull-down component is arranged between the negative transmitter differential output and the low voltage rail. The second pull-down component is arranged between the positive transmitter differential output and the low voltage rail.

Optionally, or preferably, the first pull-up component, the second pull-up component, the first pull-down component, and/or the second pull-down component is a diode, a silicon controlled rectifier, a bipolar junction transistor, or a metal-oxide-semiconductor field effect transistor.

Optionally, or preferably, the first pull-up component, the second pull-up component, the first pull-down component, and/or the second pull-down component is formed by forming a p-well and an n-well in a deep n-well.

Optionally, or preferably, the surge protection component is a parasitic component derived from the first pull-up component, the second pull-up component, the first pull-down component, and the second pull-down component.

Optionally, or preferably, the on-chip surge protection circuit is configured to withstand a surge voltage of 0 to 4 kV under conditions of open circuit voltage wave shape 1.2 µs/50 µs, and short circuit current wave shape 8 µs/20 µs.

Optionally, or preferably, the on-chip surge protection circuit is configured to withstand a surge voltage of 0 to 4 kV under conditions of open circuit voltage wave shape 10 µs/700 µs, and short circuit current wave shape 5 µs/320 µs.

According to another aspect of the present invention, there is provided an electronic device including a primary-side transformer, a secondary-side transformer, and a chip. The secondary-side transformer is coupled to the primary-side transformer. The chip is connected to the secondary-side transformer, and includes the aforementioned on-chip surge protection circuit.

Optionally, or preferably, the electronic device excludes any external resistance, and also excludes any external surge protector.

Optionally, or preferably, the electronic device is a circuit board or a digital subscriber line.

Other objects, advantages, and novel features of the invention will become more apparent from the following detailed description when taken in conjunction with the accompanying drawings.

BRIEF DESCRIPTION OF THE DRAWINGS

FIG. 8 shows a circuit diagram of the on-chip surge protection circuit according to Embodiment 1 of the present invention;

FIG. 9A shows an npn-type BJT;

FIG. 9B shows an equivalent circuit diagram of BJT in FIG. 9A;

DETAILED DESCRIPTION OF THE EMBODIMENT

Figure 1:
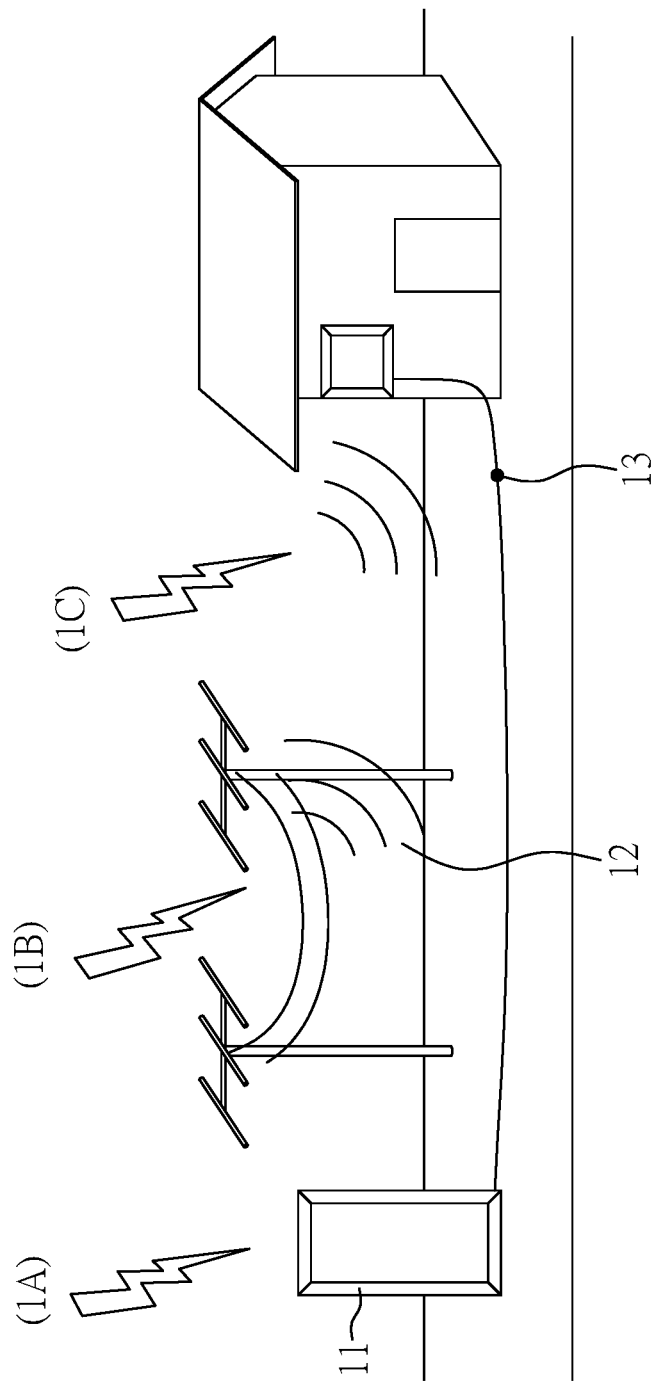
FIG. 1 shows several causes of a surge event.
Figure 2:
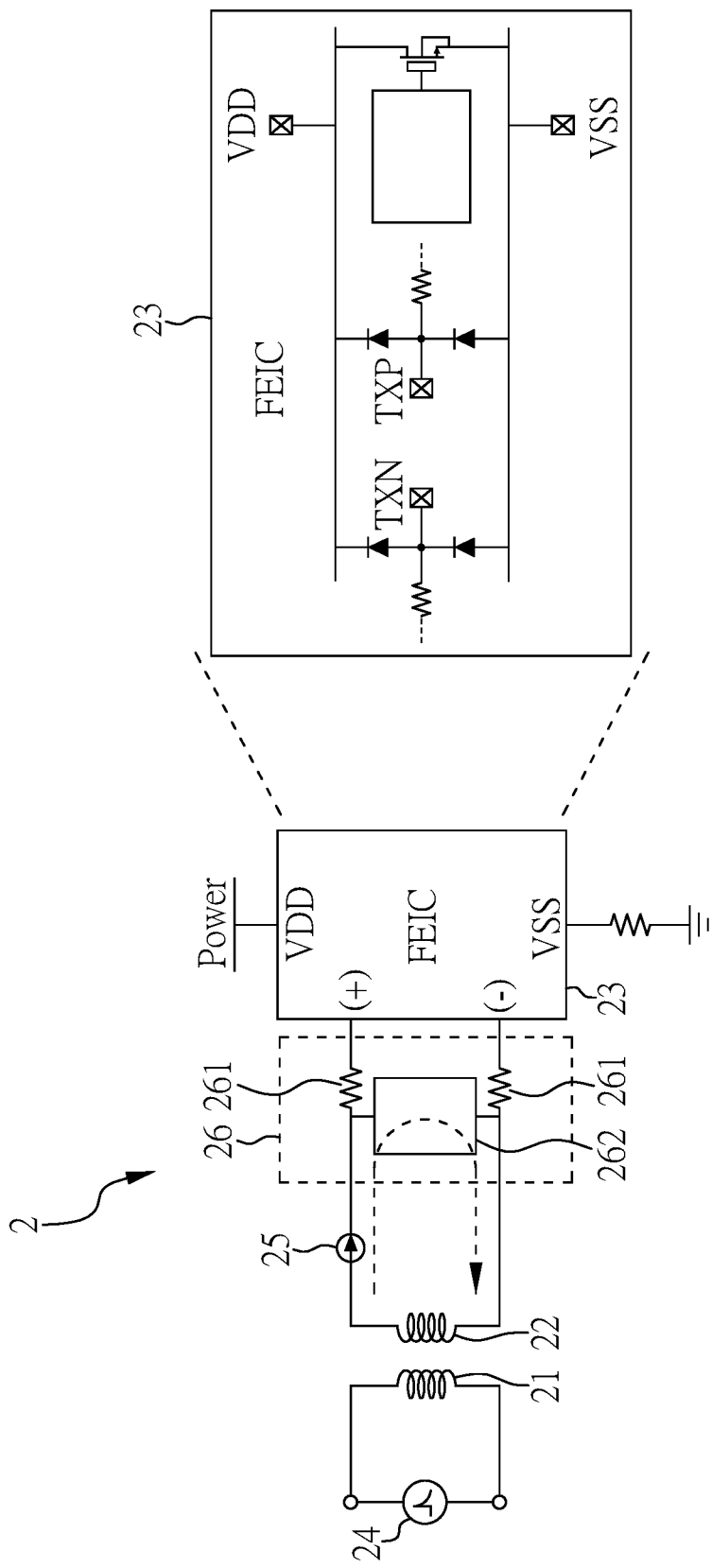
FIG. 2 shows an equivalent circuit diagram of an electronic device.

Different embodiments of the present invention are provided in the following description. These embodiments are meant to explain the technical content of the present invention, but not meant to limit the scope of the present invention. A feature described in an embodiment may be applied to other embodiments by suitable modification, substitution, combination, or separation.

It should be noted that, in the present specification, when a component is described to have an element, it means that the component may have one or more of the elements, and it does not mean that the component has only one of the element, except otherwise specified.

Moreover, in the present specification, the ordinal numbers, such as "first" or "second", are used to distinguish a plurality of elements having the same name, and it does not means that there is essentially a level, a rank, an executing order, or an manufacturing order among the elements, except otherwise specified. A "first" element and a "second" element may exist together in the same component, or alternatively, they may exist in different components, respectively. The existence of an element described by a greater ordinal number does not essentially means the existent of another element described by a smaller ordinal number.

Moreover, in the present specification, the terms, such as "top", "bottom", "left", "right", "front", "back", or "middle", as well as the terms, such as "on", "above", "under", "below", or "between", are used to describe the relative positions among a plurality of elements, and the described relative positions may be interpreted to include their translation, rotation, or reflection.

Moreover, in the present specification, when an element is described to be arranged "on" another element, it does not essentially means that the elements contact the other element, except otherwise specified. Such interpretation is applied to other cases similar to the case of "on".

Moreover, in the present specification, the terms, such as "preferably" or "advantageously", are used to describe an optional or additional element or feature, and in other words, the element or the feature is not an essential element, and may be ignored in some embodiments.

Moreover, each component may be realized as a single circuit or an integrated circuit in suitable ways, and may include one or more active elements, such as transistors or logic gates, or one or more passive elements, such as resistors, capacitors, or inductors, but not limited thereto. Each component may be connected to each other in suitable ways, for example, by using one or more traces to form series connection or parallel connection, especially to satisfy the requirements of input terminal and output terminal. Furthermore, each component may allow transmitting or receiving input signals or output signals in sequence or in parallel. The aforementioned configurations may be realized depending on practical applications.

Moreover, in the present specification, the terms, such as "system", "apparatus", "device", "module", or "unit", refer to an electronic element, or a digital circuit, an analogous circuit, or other general circuit, composed of a plurality of electronic elements, and there is not essentially a level or a rank among the aforementioned terms, except otherwise specified.

Moreover, in the present specification, two elements may be electrically connected to each other directly or indirectly, except otherwise specified. In an indirect connection, one or more elements, such as resistors, capacitors, or inductors may exist between the two elements. The electrical connection is used to send one or more signals, such as DC or AC currents or voltages, depending on practical applications.

Referential Example 1

Figure 3:
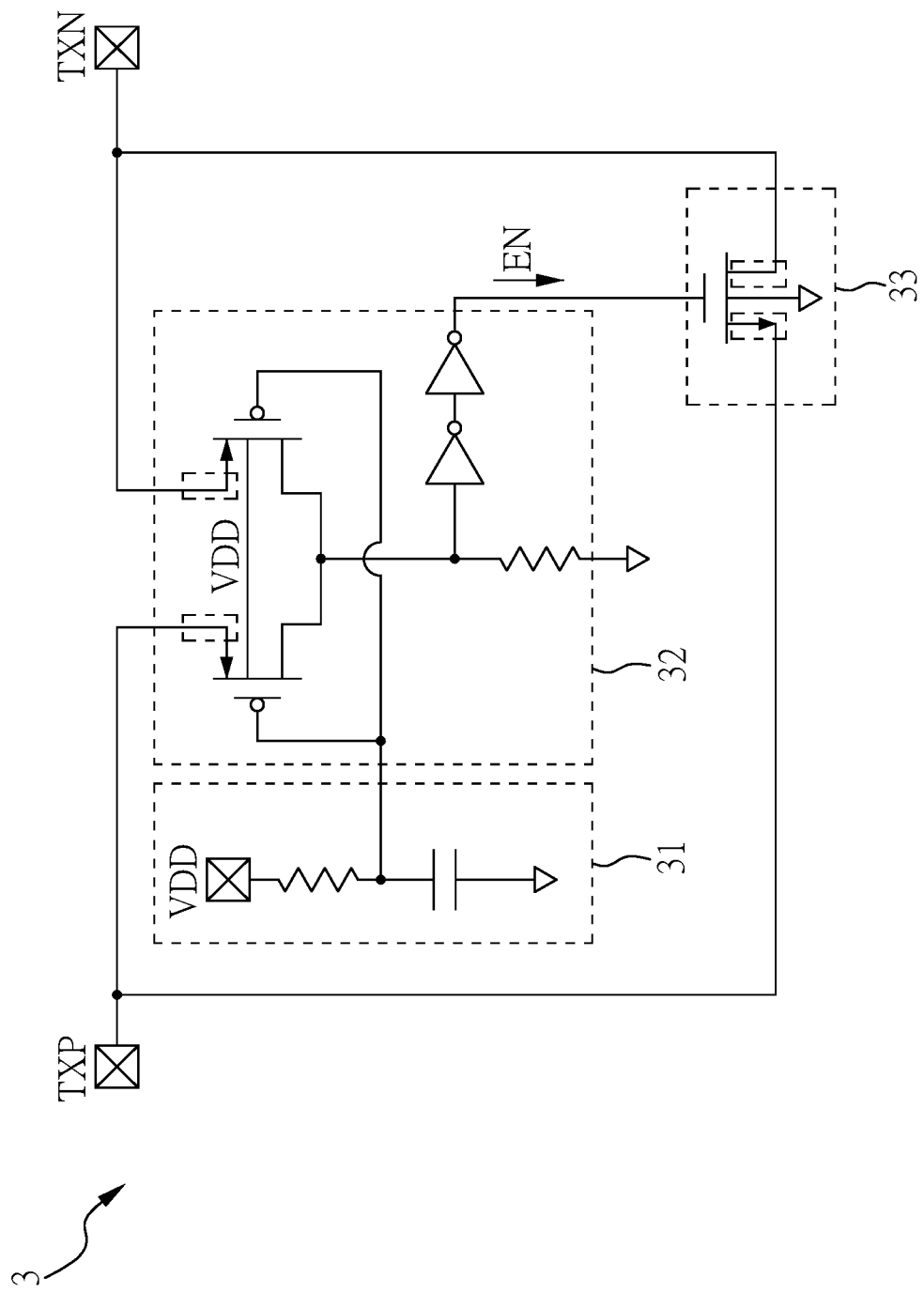
FIG. 3 shows a surge protection circuit according to Referential Example 1.

FIG. 3 shows a surge protection circuit 3 according to Referential Example 1.

In FIG. 3, the surge protection circuit 3 is arranged between a negative transmitter differential output TXN and a positive transmitter differential output TXP. The surge protection circuit 3 includes a bias unit 31, a surge detection unit 32, and a surge protection unit 33. The bias unit 31 is connected to the surge detection unit 32 to apply a predetermined bias to the surge detection unit 32. The surge detection unit 32 is connected to the surge protection unit 33. When the surge detection unit 32 detects a surge appearing between TXN and TXP, the surge detection unit 32 will generate a special control signal EN to turn on the surge protection unit 33.

In other embodiments, with the design of the present invention, it is possible to remove the bias unit 31 and the surge detection unit 32, and meanwhile, it is possible to cancel the special control signal EN that controls the surge protection unit 33, thereby reducing the area occupied by the surge protection circuit, and/or reducing the complexity of the surge protection circuit.

Objectives of the Present Invention

Figure 4:
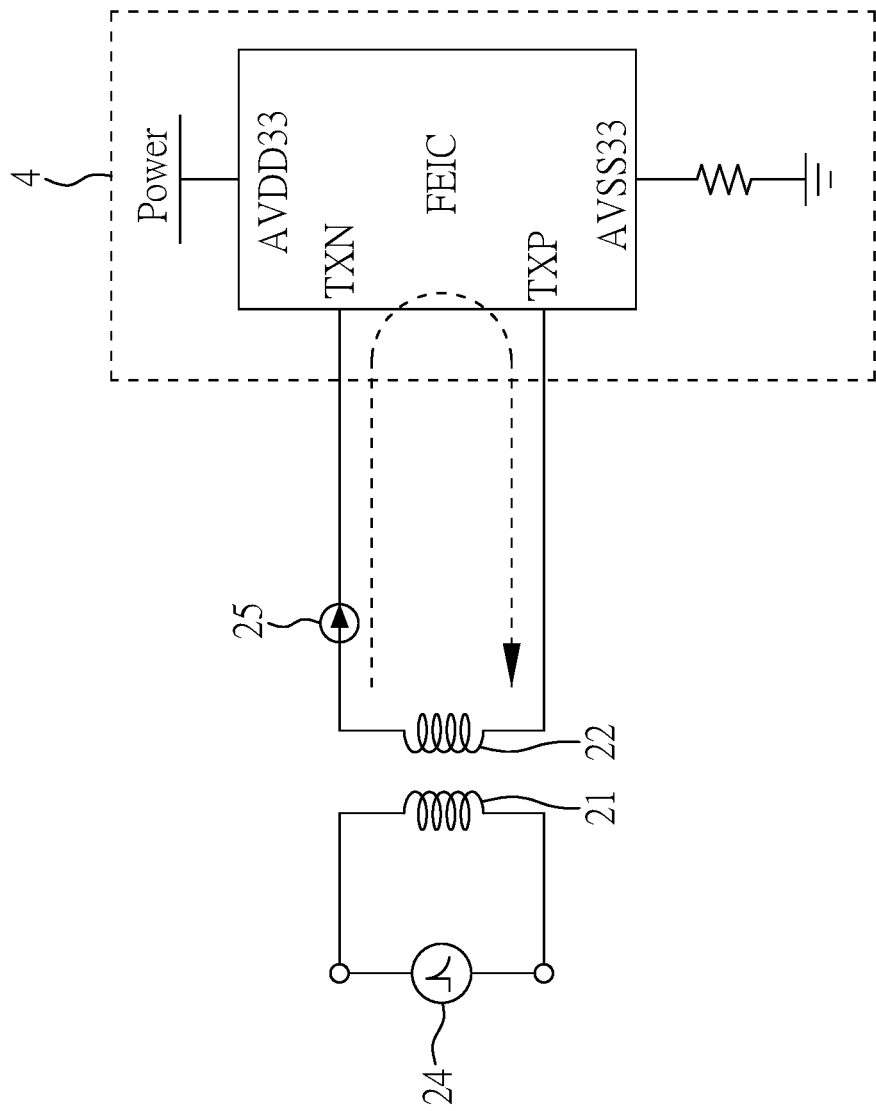
FIG. 4 shows a schematic diagram of the automatic self-protection chip according to one embodiment of the present invention.

FIG. 4 shows a schematic diagram of the automatic self-protection chip 4 according to one embodiment of the present invention.

In FIG. 4, a surge 24 is coupled from a primary-side transformer 21 to a secondary-side transformer 22, and induces an overcurrent 25 in the secondary-side transformer 22, which flows through a transmitter output of the automatic self-protection chip 4. The present invention aims to realize the on-chip surge protection circuit inside the automatic self-protection chip 4. Therefore, as illustrated in FIG. 4, the surge protection unit outside the chip has been removed.

Figure 13A:
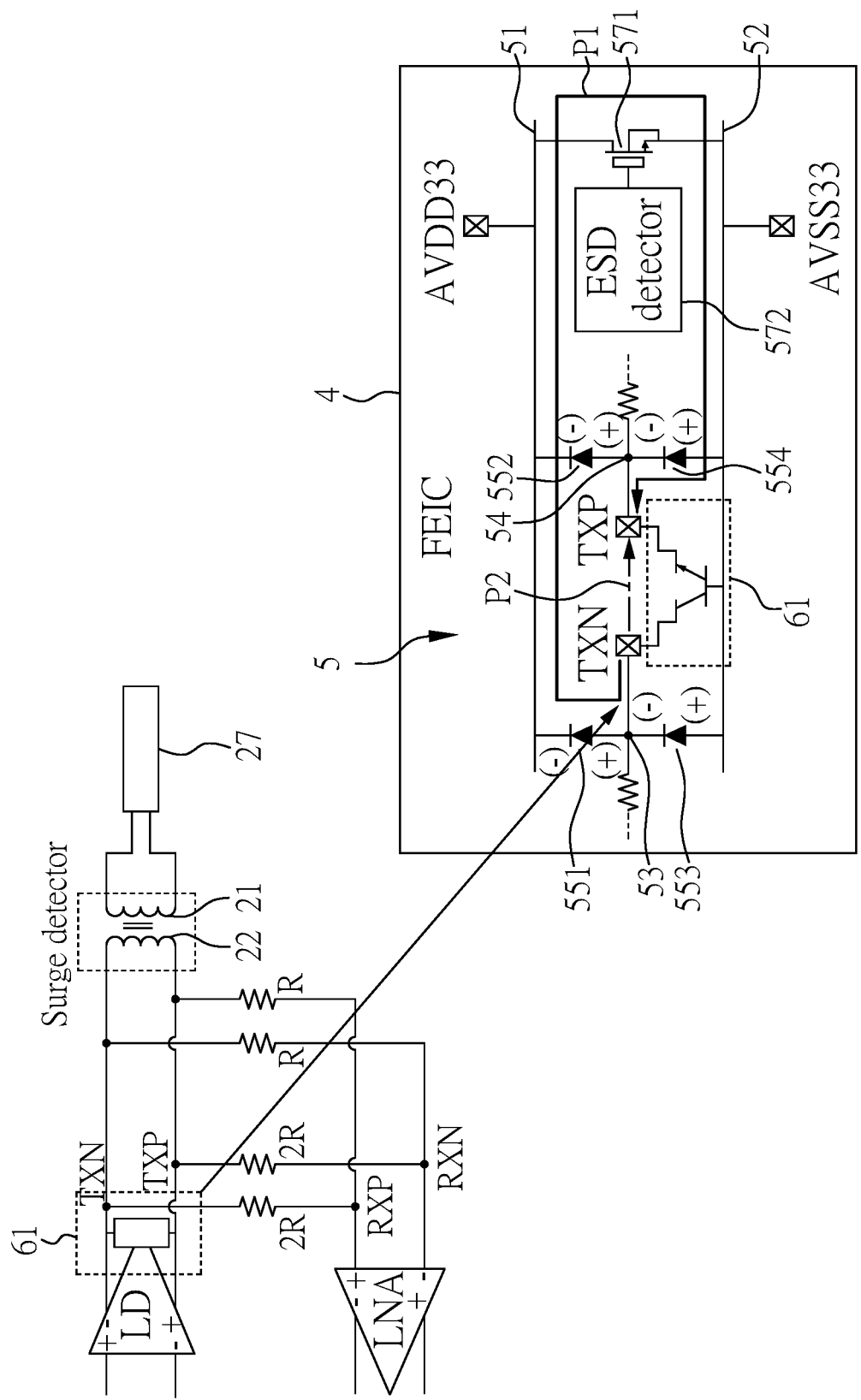
FIGS. 13A, 13B, 13C, and 13D show detailed connections of the on-chip surge protection component according to Embodiment 4 of the present invention, when using a bipolar junction transistor, a silicon controlled rectifier, a field oxide device, or a metal-oxide-semiconductor field effect transistor, respectively.

The automatic self-protection chip 4 includes the following pins:

A negative receiver differential input RXN (i.e. differential receiver input N), referring to FIG. 13A, for example; a positive receiver differential input RXP (i.e. differential receiver input P), referring to FIG. 13A, for example; a negative transmitter differential output TXN (i.e. differential transmitter output N); and a positive transmitter differential output TXP (i.e. differential transmitter output P), wherein the negative receiver differential input RXN and the positive receiver differential input RXP forms a receiver input RX of the automatic self-protection chip 4, and the negative transmitter differential output TXN and the positive transmitter differential output TXP forms the transmitter output TX of the automatic self-protection chip 4.

Figures 5, 6:
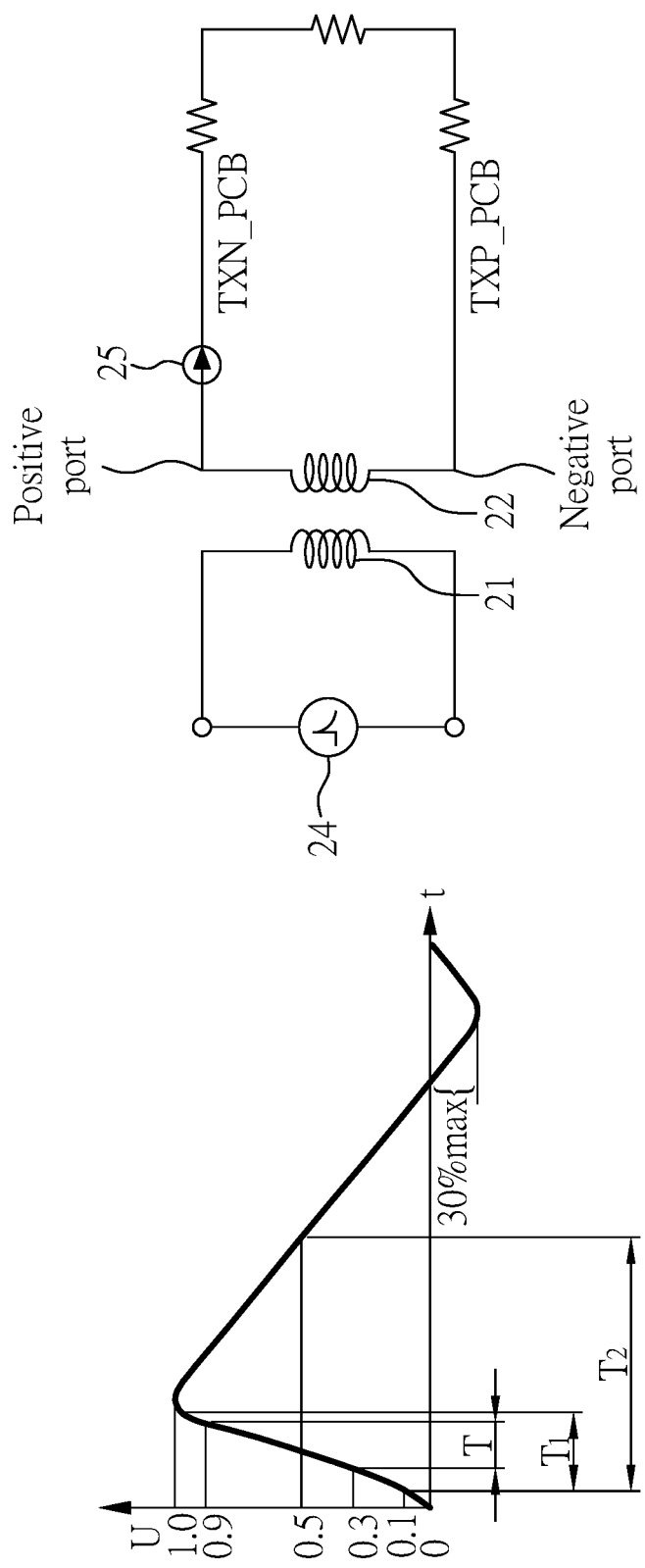
FIG. 5 shows a waveform of a surge.
FIG. 6 shows an equivalent circuit diagram of a surge testing network.

FIG. 5 shows a waveform of a surge.

In order to test the performance to deal with a surge for each device, a surge may be generated by a combination wave generator (CWG). The present invention is designed to satisfy the following Specification (or Condition) 1 and Specification (or Condition) 2.

Specification 1: open (circuit) voltage wave is 1.2 μs/50 μs, and short (circuit) current wave is 8 μs/20 μs. Herein, "μs" refers to microsecond. The detailed definitions are shown in Table 1.

TABLE 1

| Specification 1 | | |
|---|---|---|
| Specification 1 | Front time Tf (μs) | Decay time Td (μs) |
| Open voltage | Tf = 1.67 × T = 1.2 ± 30% | Td = T2 = 50 ± 20% |
| Short current | Tf = 1.25 × T1 = 8 ± 20% | Td = 1.18 × T2 = 20 ± 20% |

Specification 2: open circuit voltage wave is 10 μs/700 μs, and short circuit current wave is 5 μs/320 μs. The detailed definitions are shown in Table 2.

TABLE 2

| Specification 2 | | |
|---|---|---|
| Specification 2 | Front time Tf (μs) | Decay time Td (μs) |
| Open voltage | Tf = 1.67 × T = 10 ± 30% | Td = T2 = 700 ± 20% |
| Short current | Tf = 1.25 × T1 = 5 ± 20% | Td = 1.18 × T2 = 320 ± 20% |

FIG. 6 shows an equivalent circuit diagram of a surge testing network. In FIG. 6, the surge 24 is coupled from the primary-side transformer 21 to the secondary-side transformer 22, and induces the overcurrent 25 in the secondary-side transformer 22, which flows from a positive port TXN_PCB of a circuit board to a negative port TXP_PCB of the circuit board through several resistances (shown but not labeled), wherein each resistance may be 10 ohm.

Figure 7:
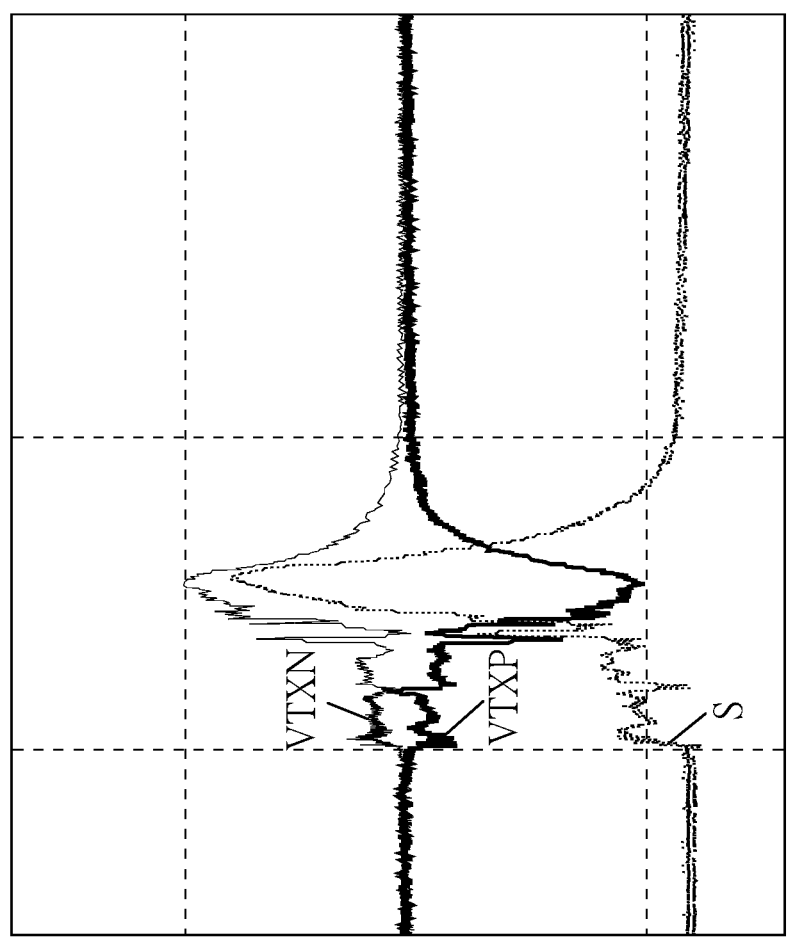
FIG. 7 shows a waveform of a surge, a negative differential surge voltage, and a positive differential surge voltage.

FIG. 7 shows a waveform of a surge S, a negative differential surge voltage VTXN, and a positive differential surge voltage VTXP. In a surge event, the surge S induces the negative differential surge voltage VTXN at TXN, and induces the positive differential surge voltage VTXP at TXP.

Embodiment 1

FIG. 8 shows a circuit diagram of the on-chip surge protection circuit 5 according to Embodiment 1 of the present invention.

As shown in FIG. 8, the on-chip surge protection circuit 5 of the present invention includes a high voltage rail 51, a low voltage rail 52, a first node 53, and a second node 54. The high voltage rail 51 is connected to a pin AVDD33, the low voltage rail 52 is connected to the pin AVSS33, the first node 53 is connected to a negative transmitter differential output TXN, and the second node 54 is connected to a positive transmitter differential output TXP.

The on-chip surge protection circuit 5 further includes a first diode 551, a second diode 552, a third diode 553, a fourth diode 554, and a bipolar junction transistor (BJT) 56. The first diode 551's cathode (−) is connected to the high voltage rail 51, and its anode (+) is connected to the first node 53. The second diode 552's cathode (−) is connected to the high voltage rail 51, and its anode (+) is connected to the second node 54. The third diode 553's cathode (−) is connected to the first node 53, and its anode (+) is connected to the low voltage rail 52. The fourth diode 554's cathode (−) is connected to the second node 54, and its anode (+) is connected to the low voltage rail 52. BJT 56's collector (C) is connected to TXN, its emitter (E) is connected to TXP, and its base (B) is connected to the low voltage rail 52.

Each of the aforementioned diodes may be formed by forming a p-well (PW) and an n-well (NW) in a deep n-well (DNW).

In the on-chip surge protection circuit 5, BJT 56 is exactly the surge protection component inside the chip, and it is arranged among TXN, TXP, and the ground GND (i.e. the low voltage rail 52). In other embodiments, BJT 56 may be replaced by a silicon controlled rectifier, a field oxide device, or a metal-oxide-semiconductor field effect transistor, but not limited thereto. Each embodiment will be discussed in detail hereinafter.

FIG. 9A shows an npn-type BJT with its collector current $i_C$, base current $i_B$, and emitter current $i_E$ labeled. FIG. 9B shows an equivalent circuit diagram of BJT of FIG. 9A with its collector-emitter voltage $V_{CE}$ ($V_{CE}=V_C-V_E$) and base-emitter voltage $V_{BE}$ ($V_{BE}=V_B-V_E$) labeled. If the emitter voltage is smaller than the base voltage $V_B$, and the base voltage $V_B$ is further smaller than the collector voltage $V_C$ (i.e. $V_E<V_B<V_C$), BJT will be turned on to provide a by-pass path P2 to drain the surge current away. Therefore, the surge current will not totally flow into a main path P1 to cause a whole or a partial damage of the circuit.

In a normal operation when there is no surge or the surge event has disappeared, TXN's voltage is greater than 0, and TXP's voltage is also greater than 0, so BJT 56 will not be turned on but remain turned off. A transmitting signal (TX signal) can normally be sent from the transmitter output TX of the chip, through a transformer, to a predetermined receiver. For example, the transmitting signal may be sent to a (remote) receiver in another place; or can be sent back to a (local) receiver in an original place during a verification process.

As previously discussed, referring to FIG. 7, in the surge event, the surge S can induce the negative differential surge voltage VTXN at TXN, and induce the positive differential surge voltage VTXP at TXP.

At this time, BJT's three terminals, TXN, TXP, and the ground GND (i.e. the low voltage rail 52) have their respective voltages VTXN, VTXP, and VGND satisfying one of the following relations: (Relation 1) VTXN is smaller than VGND, and VGND is further smaller than VTXP (i.e. VTXN<VGND<VTXP); or (Relation 2) VTXP is smaller than VGND, and VGND is further smaller than VTXN (i.e. VTXP<VGND<VTXN). With the fact that BJT is turned on under the condition. $V_E<V_B<V_C$, the surge S can lead the voltages at the terminals of BJT 56 to satisfy the aforementioned Relation 1 or Relation 2, and thus make BJT 56 turned on, thereby triggering the automatic self-protection mechanism to deal with the surge.

It should be noted that, the aforementioned triggering mechanism is realized thanks to the fact that the inventors have understood that, the surge S can induce the negative differential surge voltage VTXN and the positive differential surge voltage VTXP respectively at TXN and TXP, and they can exactly satisfy the turn-on condition of the surge protection component such as BJT. According to the present invention, this is called "automatic triggering mechanism", which means that, when the surge is coupled to the secondary-side transformer and enters into the chip from its transmitter output TX, the surge protection component will be automatically turned on.

In this way, a simplified surge protection circuit is realized. In particular, according to the automatic triggering mechanism of the present invention, it does not need the bias unit 31 and the surge detection unit 32 of the surge protection circuit 3 of Referential Example 1 in FIG. 3 anymore, and they can be removed (or omitted), and meanwhile, it does not need the special control signal EN to control the surge protection unit 33 anymore, thereby reducing the area occupied by the surge protection circuit, and/or reducing the complexity of the surge protection circuit.

Referring back to FIG. 8, optionally or preferably, the on-chip surge protection circuit 5 of the present invention may further include an electrostatic discharge (ESD) protection component 571 and an electrostatic discharge detector 572. (It is to be understood that, surge protection is different from ESD protection.) The electrostatic discharge protection component 571 may be a transistor, which has a source and a drain respectively connected to the high voltage rail 51 and the low voltage rail 52, and a gate connected to the electrostatic discharge detector 572. The electrostatic discharge detector 572 is configured to turn on the electrostatic discharge protection component 571 when an electrostatic discharge event is detected, so as to drain the current generated by the electrostatic away.

Embodiment 2

Figure 10:
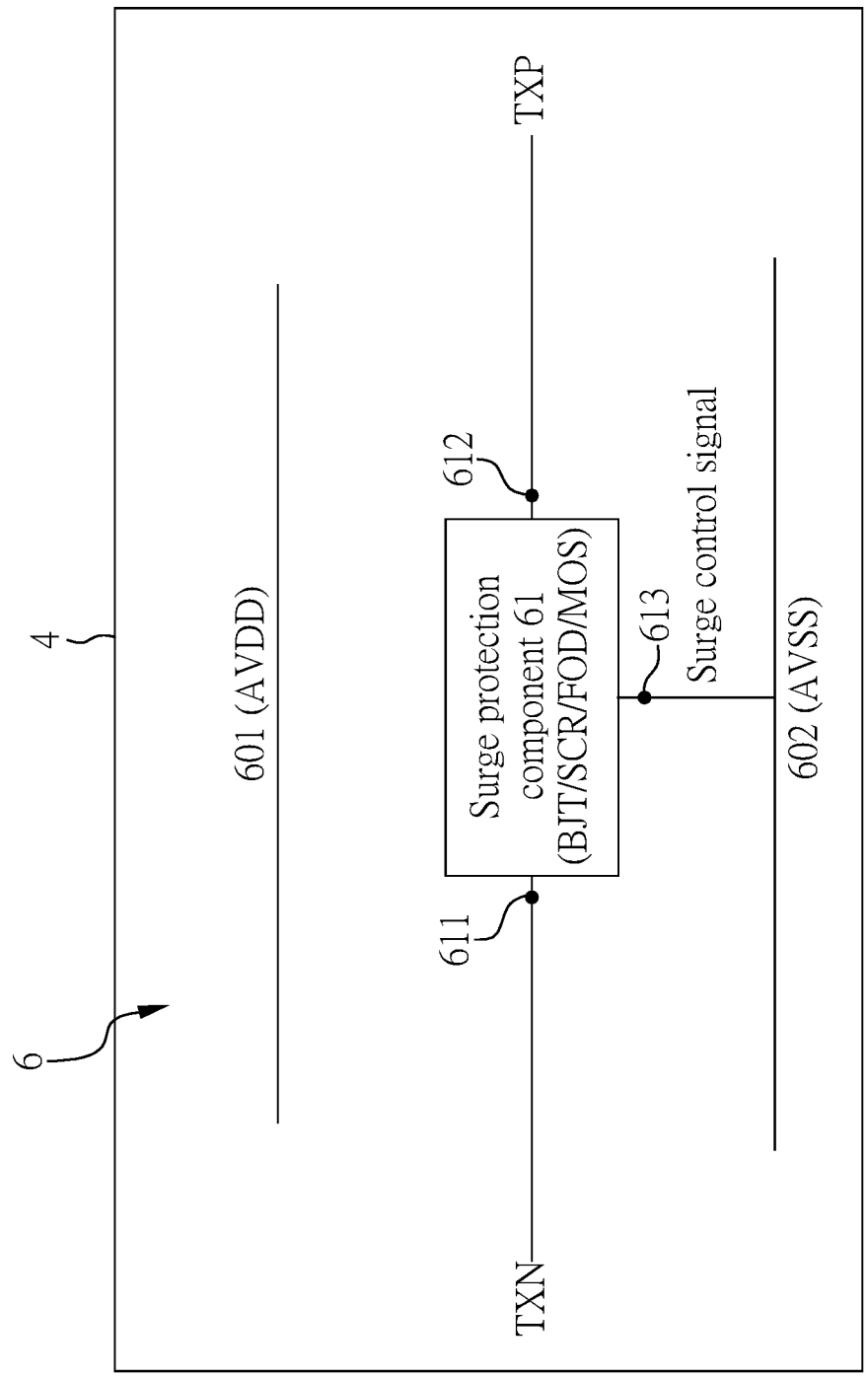
FIG. 10 shows a circuit diagram of the on-chip surge protection circuit according to Embodiment 2 of the present invention.

FIG. 10 shows a circuit diagram of the on-chip surge protection circuit 6 according to Embodiment 2 of the present invention.

The on-chip surge protection circuit 6 of the present invention exists inside the chip 4. The surge protection circuit 6 includes a high voltage rail 601 (whose voltage is AVDD), a low voltage rail 602 (whose voltage is AVSS), a negative transmitter differential output TXN, a positive transmitter differential output TXP, and a surge protection component 61.

The surge protection component 61 includes a first end 611, a second end 612, and a control end 613 respectively connected to TXN, TXP, and 602. Preferably, the first end 611 and the second end 612 are symmetric. If the second end 612's voltage is smaller than AVSS, and AVSS is further smaller than the first end 611's voltage, the surge protection component 61 will be turned on, such that current flows from the first end 611 to the second end 612. If the first end 611's voltage is smaller than AVSS, and AVSS is further smaller than the second end 612's voltage, the surge protection component 61 will also be turned on, such that current flows from the second end 612 to the first end 611. It should be noted that, the voltage comparison takes into consideration not only the absolute values but also the signs (positive or negative) of the voltages.

Herein, the surge protection component 61 may be a bipolar junction transistor, a silicon controlled rectifier, a field oxide device, or a metal-oxide-semiconductor field effect transistor, but not limited thereto.

The inventors have appreciated that, the surge S can induce the negative differential surge voltage VTXN and the positive differential surge voltage VTXP respectively at TXN and TXP, satisfying one of the following relations: (Relation 1) VTXN is smaller than AVSS, and AVSS is further smaller than VTXP (i.e. VTXN<AVSS<VTXP); or (Relation 2) VTXP is smaller than AVSS, and AVSS is smaller than VTXN (i.e. VTXP<AVSS<VTXN), which can further satisfy the turn-on condition of the surge protection component 61, and realize the automatic triggering mechanism of the surge protection component 61.

In a deep consideration, AVSS (i.e. the ground GND) which the control end 613 of the surge protection component 61 is connected to can exactly serve as a natural (or inherent) surge control signal. In other words, the inventors have appreciated the characteristics of the differential surge voltage, and on this basis, the present invention use the AVSS (i.e. the ground GND) directly as the surge control signal, and it does not need the surge detection unit 32 (and its accompanied bias unit 31) as shown in FIG. 3 to especially generate the special control signal EN anymore. In this way, a simplified surge protection circuit is realized.

Embodiment 3

Figure 11:
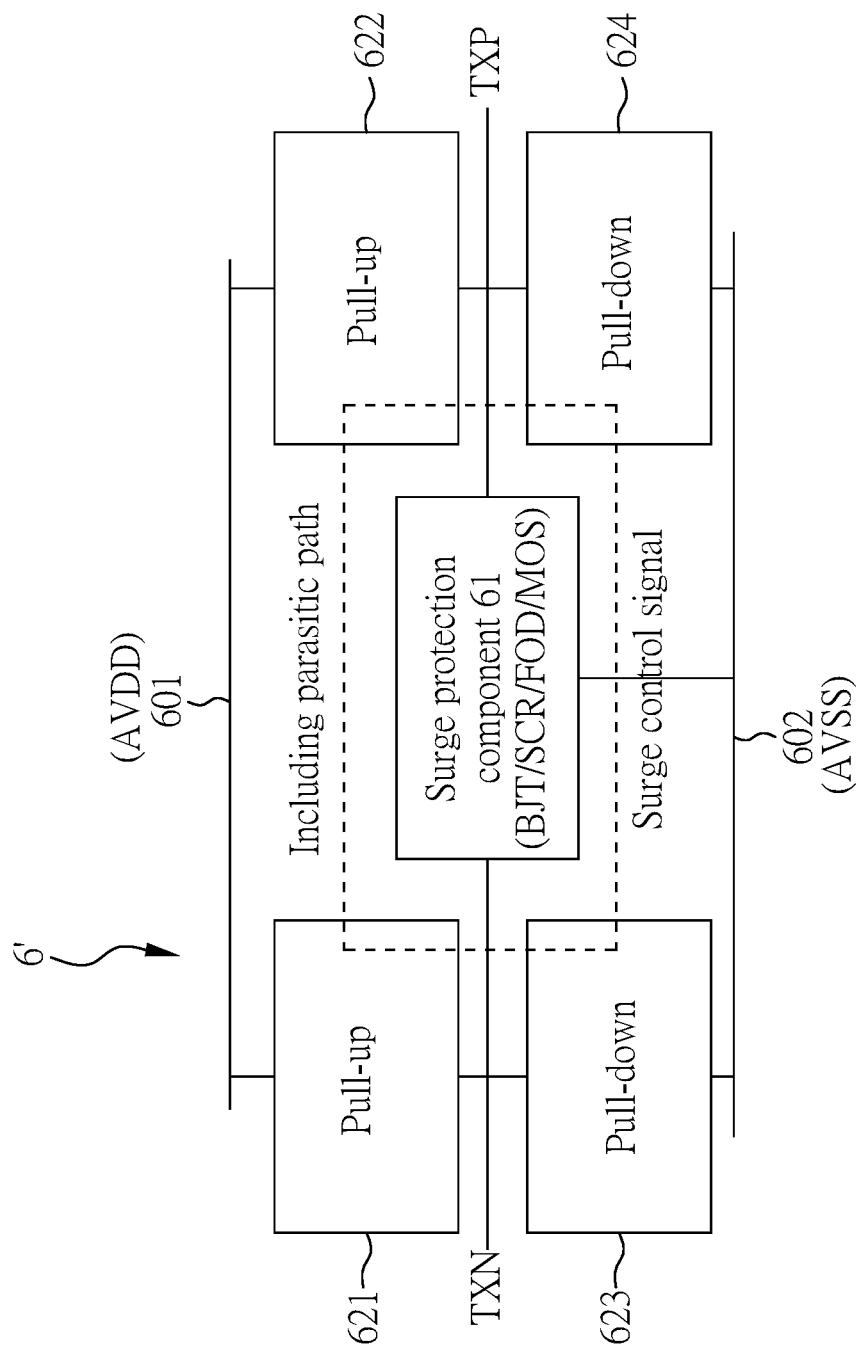
FIG. 11 shows a circuit diagram of the on-chip surge protection circuit according to Embodiment 3 of the present invention.

FIG. 11 shows a circuit diagram of the on-chip surge protection circuit 6' according to Embodiment 3 of the present invention.

The on-chip surge protection circuit 6' in Embodiment 3 in relation of FIG. 11 is a variant from the on-chip surge protection circuit 6 in Embodiment 2 in relation of FIG. 10. It includes the high voltage rail 601 (whose voltage is AVDD), the low voltage rail 602 (whose voltage is AVSS), the negative transmitter differential output TXN, and the positive transmitter differential output TXP, and further includes a first pull-up component 621, a second pull-up component 622, a first pull-down component 623, and a second pull-down component 624.

The first pull-up component 621 is arranged between the high voltage rail 601 and TXN, the second pull-up component 622 is arranged between the high rail 601 and TXP, the first pull-down component 623 is arranged between TXN and the low voltage rail 602, and the second pull-down component 624 is arranged between TXP and the low voltage rail 602. The first pull-up component 621, the second pull-up component 622, the first pull-down component 623, and the second pull-down component 624 may be a diode, a silicon controlled rectifier, a bipolar junction transistor, or a metal-oxide-semiconductor field effect transistor, but not limited thereto.

In the embodiment 3, the surge protection component 61 may be in the form of a parasitic component, and includes a parasitic path. The surge protection component 61 can provide the automatic self-protection mechanism, in particular the automatic triggering mechanism, as previously discussed in the description of Embodiment 2.

Embodiment 4

Figure 12:
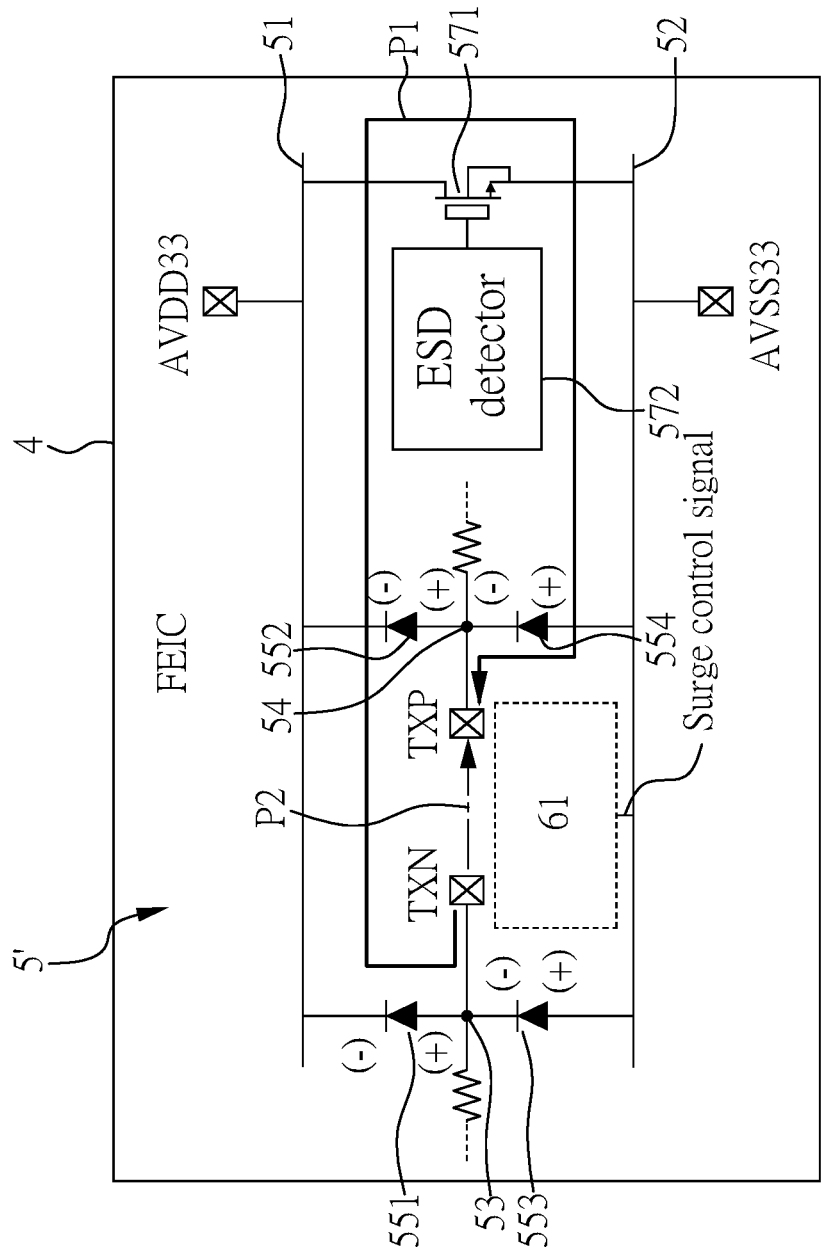
FIG. 12 shows a circuit diagram of the on-chip surge protection circuit according to Embodiment 4 of the present invention.

FIG. 12 shows a circuit diagram of the on-chip surge protection circuit 5' according to Embodiment 4 of the present invention.

The circuit diagram of the on-chip surge protection circuit 5' in FIG. 12 is a variant from the on-chip surge protection circuit 5 in FIG. 8. Herein, BJT 56 in FIG. 8 has been replaced by a general surge protection component 61, such as a bipolar junction transistor, a silicon controlled rectifier, a field oxide device, or a metal-oxide-semiconductor field effect transistor in FIG. 12. The components in FIG. 12 will not be discussed again if they have been discussed in the description in relation of FIG. 8.

FIGS. 13A, 13B, 13C, and 13D show detailed connections of the on-chip surge protection component 61 according to Embodiment 4 of the present invention, when using the bipolar junction transistor, the silicon controlled rectifier, the field oxide device, or the metal-oxide-semiconductor field effect transistor, respectively. Meanwhile, the figures also show the relative location of the surge protection component 61 in the electronic device. The electronic device may be a circuit board or a digital subscriber line (DSL).

The electronic device includes a primary-side transformer 21, a secondary-side transformer 22, a loop component 27, a first logic component LD, and a second logic component LNA, TXN, TXP, RXP, and RXN are pins of the chip, as previously mentioned. The surge protection component 61 of the present invention exists between TXN and TXP, and is integrated inside the chip.

Thanks to the fact that the inventors have appreciated the characteristics of the differential surge, the present invention does not need an additional surge detector anymore. On the contrary, the transformers 21 and 22 can directly serve as a natural (or inherent) surge detector to trigger the automatic self-protection mechanism of the chip 4.

In FIG. 13A, the surge protection component 61 uses a bipolar junction transistor, similar to BJT 56 in FIG. 8.

Figure 13B:
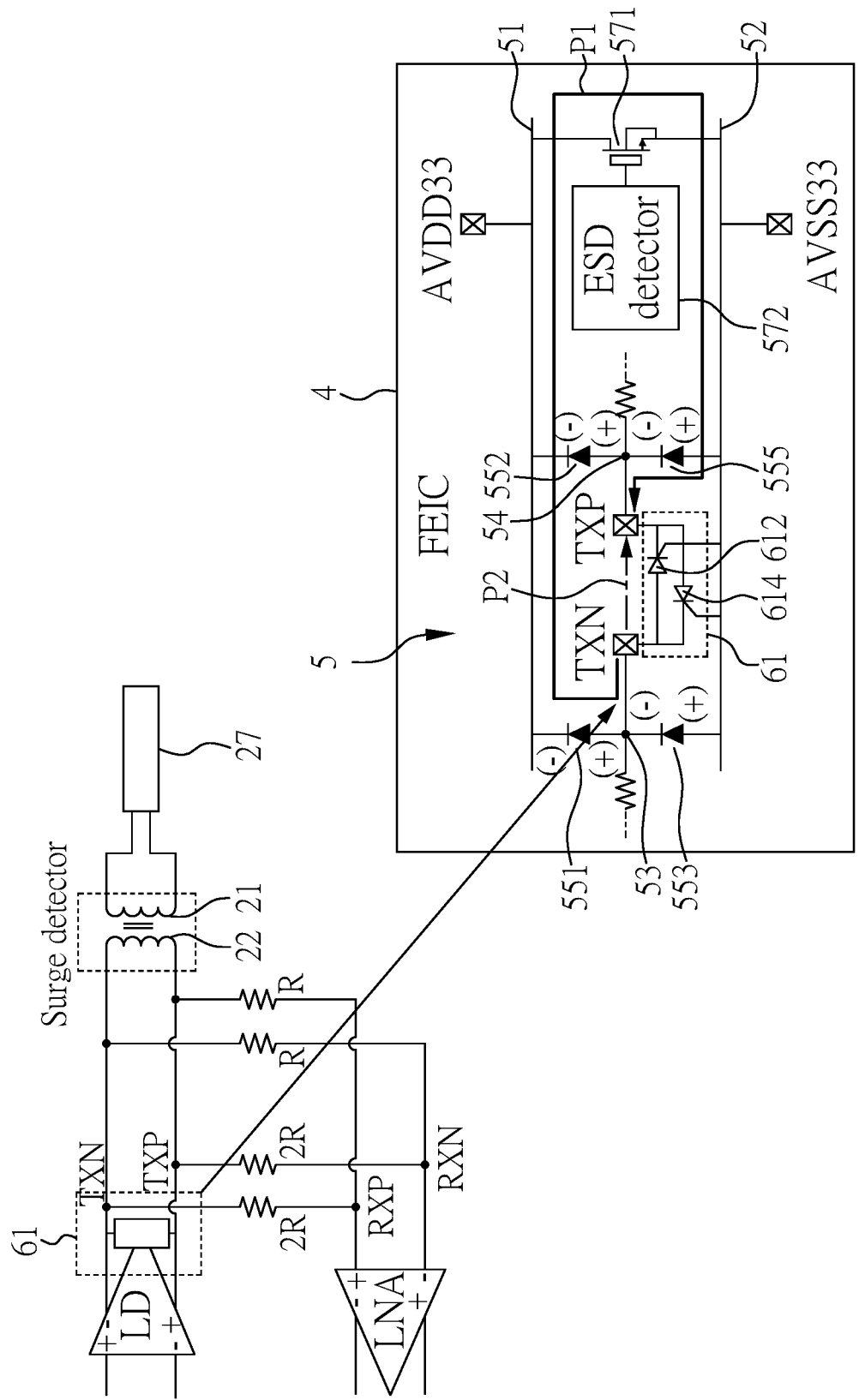

In FIG. 13B, the surge protection component 61 uses two silicon controlled rectifiers 614 and 615. The first silicon controlled rectifier 611's anode is connected to TXP, its cathode is connected to TXN, and its gate is connected to the low voltage rail 52. The second silicon controlled rectifier 612's anode is connected to TXN, its cathode is connected to TXP, and its gate is connected to the low voltage rail 52.

Figure 13C:
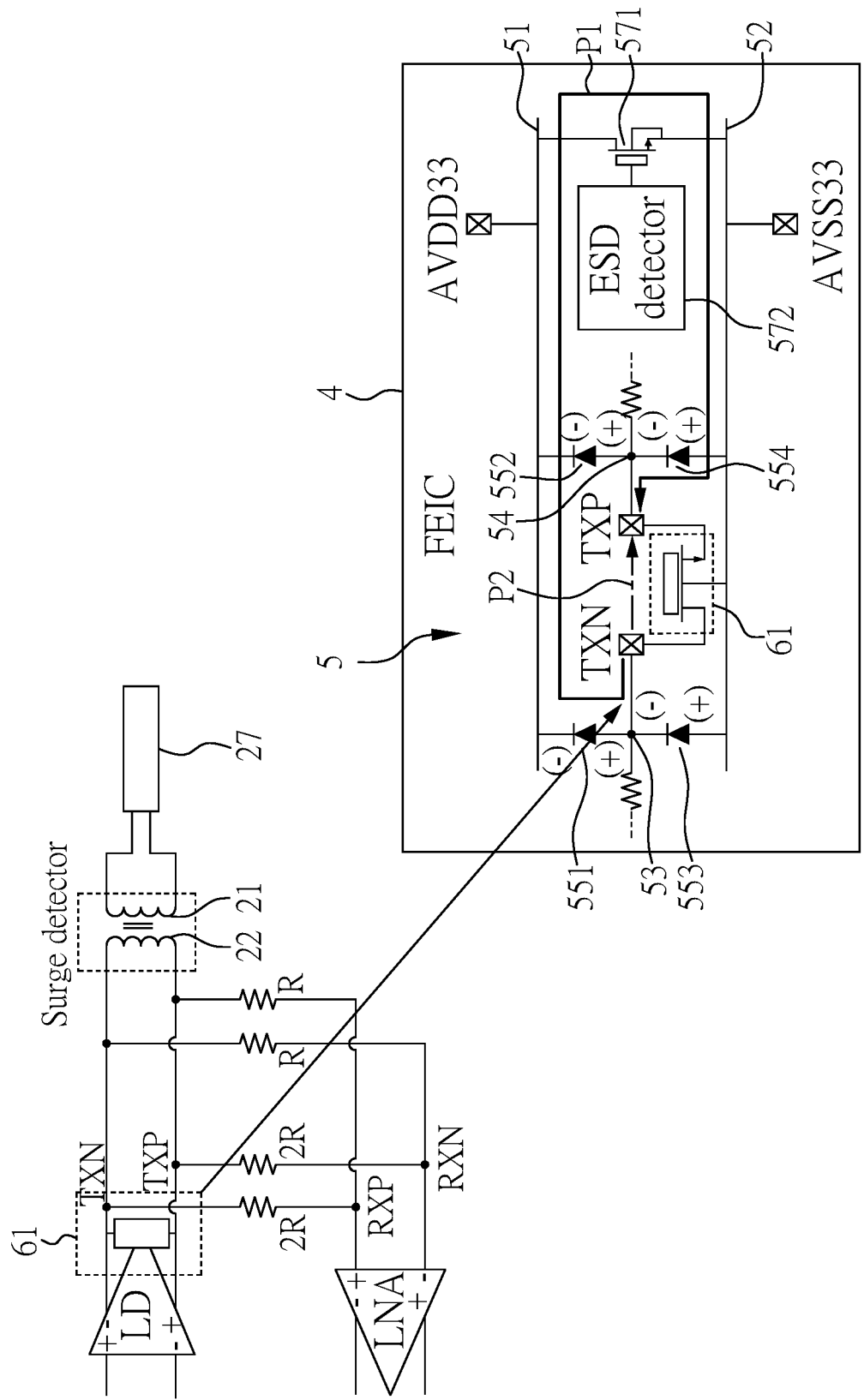

In FIG. 13C, the surge protection component 61 uses a field oxide device, wherein its drain is connected to TXN, its source is connected to TXP, and its body is connected to the low voltage rail 52. It is of course possible to interchange the drain and the source according to the symmetry of the field oxide device.

Figure 13D:
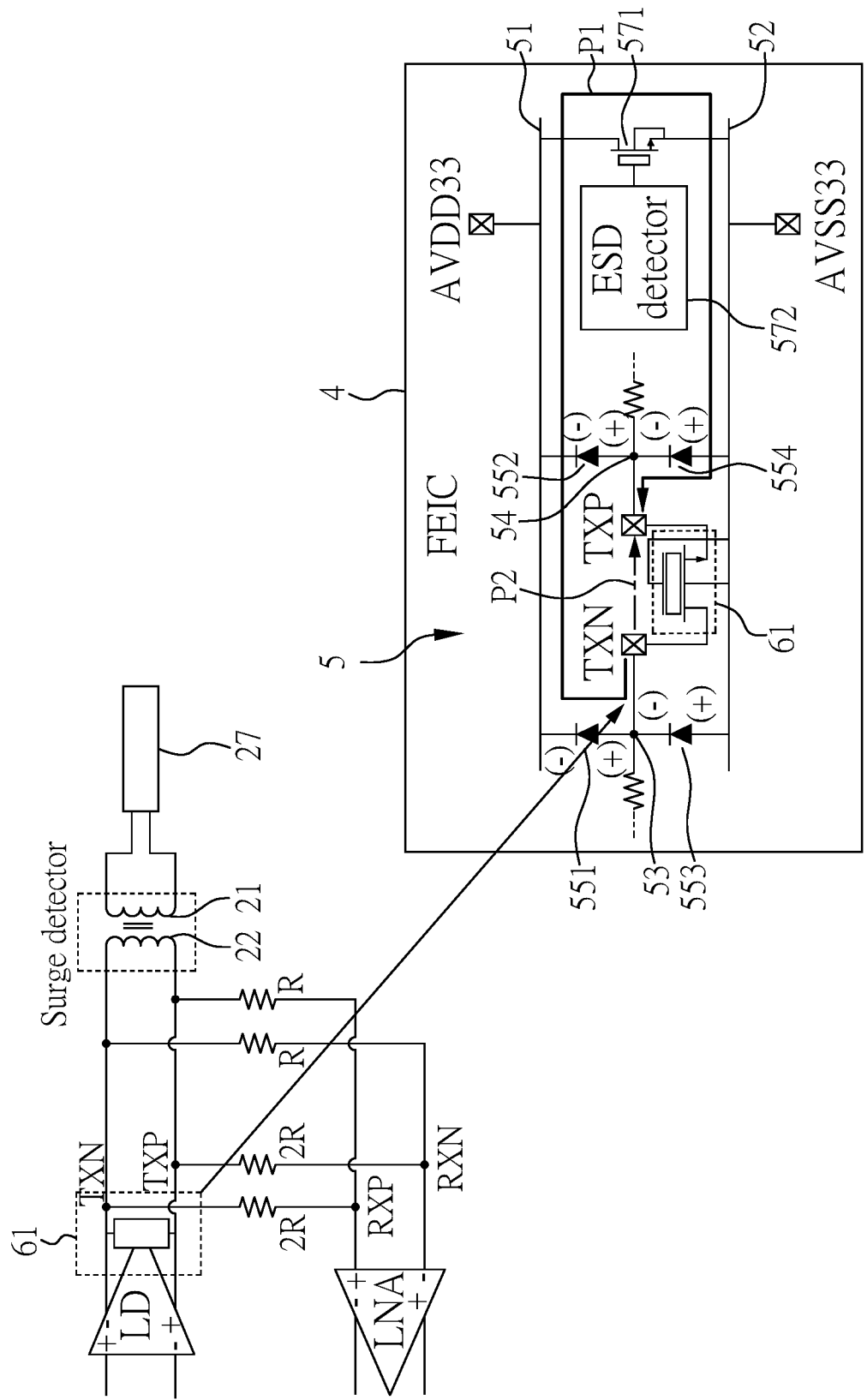

In FIG. 13D, the surge protection component 61 uses a metal-oxide-semiconductor field effect transistor, wherein its drain is connected to TXN, its source is connected to TXP, and its gate and body are both connected to the low voltage rail 52. It is of course possible to interchange the drain and the source, according to the symmetry of the metal-oxide-semiconductor field effect transistor.

Test Result

The test is to compare, when the external resistance 261 is set to be 0 ohm, the performances between the chip without the on-chip surge protection circuit of the present invention and the automatic self-protection chip 4 using the on-chip surge protection circuit 5 of the present invention. The combination wave generator (CWG) is used to generate the open circuit voltage wave and the short circuit current wave that satisfy Specification 1 in Table 1 and Specification 2 in Table 2 shown above to build the test environment.

The real test result (also known as "silicon result") proves that, when the external resistance 261 is set to be 0 ohm, the chip without the on-chip surge protection circuit of the present invention can only withstand a surge of voltage of 750 V (volt) in the test under Specification 1; it can only withstand a surge of voltage of 250 V in the test under Specification 2.

Advantageously, the automatic self-protection chip 4 using the on-chip surge protection circuit 5 of the present invention can withstand a surge of extremely high voltage up to 4 kV (kilovolt) for example, in the test under Specification (or Condition) 1; it can withstand a surge of extremely high voltage up to 3.5 kV to 4 kV for example, in the test under Specification (or Condition) 2. The performance of the present invention is dramatically improved, and sufficiently satisfies the requirement to withstand a surge of at least 1 kV, which the present invention pursues.

In one embodiment of the present invention, a BJT structure is formed by forming a p-well PW on a p-substrate PSUB; forming three island portions through two oxides OX1 and OX2; and forming three n+ doped regions N1, N2, and N3 on the three island portions. N1 is connected to the negative transmitter differential output TXN, N2 is connected to the positive transmitter differential output TXP, and PSUB may serve as the ground. BJT is thus recognized to exist among TXN, TXP, and PSUB, and it is formed of oxide diffusion (OD) diode.

Figure 14:
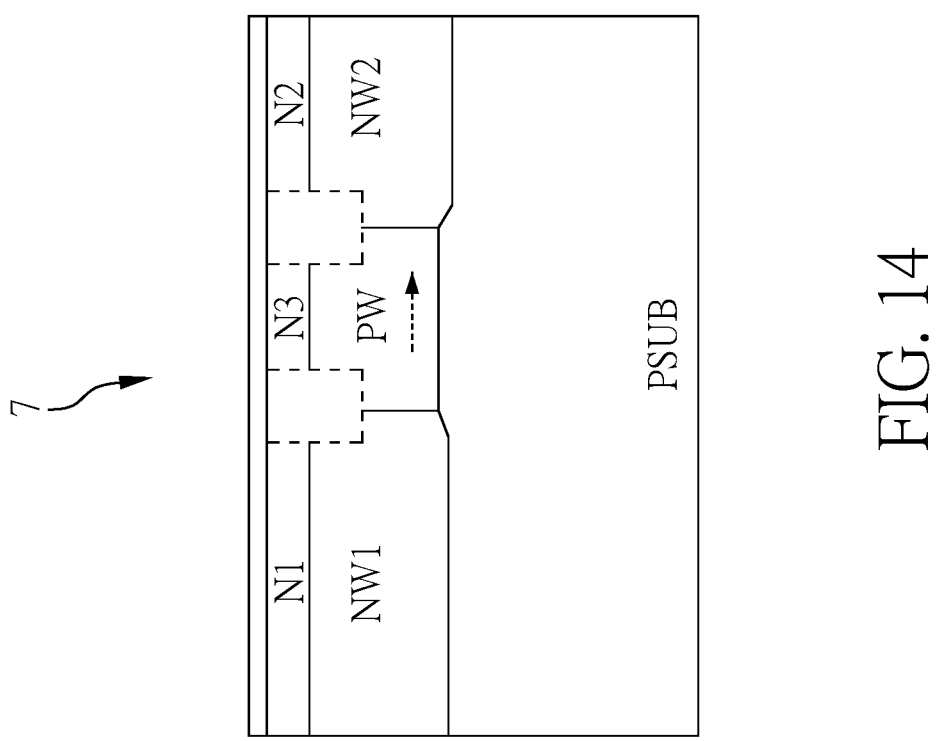
FIG. 14 shows a BJT structure according to another embodiment of the present invention.

FIG. 14 shows a BJT structure 7 according to one embodiment of the present invention.

In FIG. 14, the BJT structure 7 is formed by forming a p-well PW on a p-substrate PSUB; forming two n-wells NW1 and NW2 (preferably further including deep n-wells) respectively on two sides of the p-well PW; and forming three n+ doped regions N1, N2, and N3 respectively on PW, NW1, and NW2. N1 is connected to the negative transmitter differential output TXN, N2 is connected to the positive transmitter differential output TXP, and PSUB may serve as the ground. BJT is thus recognized to exist among TXN, TXP, and PSUB, and is formed of well diode(s).

Any of aforementioned BJT structures may be used to realize the present invention depending on practical applications. Regarding the electrical characteristics of the oxide diffusion diode and the (deep) n-well diode, the former is weaker and the latter is stronger in term of the breakdown voltages of the diodes; and the former is worse and the latter is better in term of the performances to deal with the surge.

Advantages of the Present Invention

The surge protection component of the present invention is an on-chip component, and arranged among TXN, TXP, and GND. The surge protection component can drain surge current away because the differential voltage difference is induced among TXN, TXP, and GND. The surge protection component is preferably a parasitic component existing in the integrated circuit layout between TXN and TXP.

Figure 15:
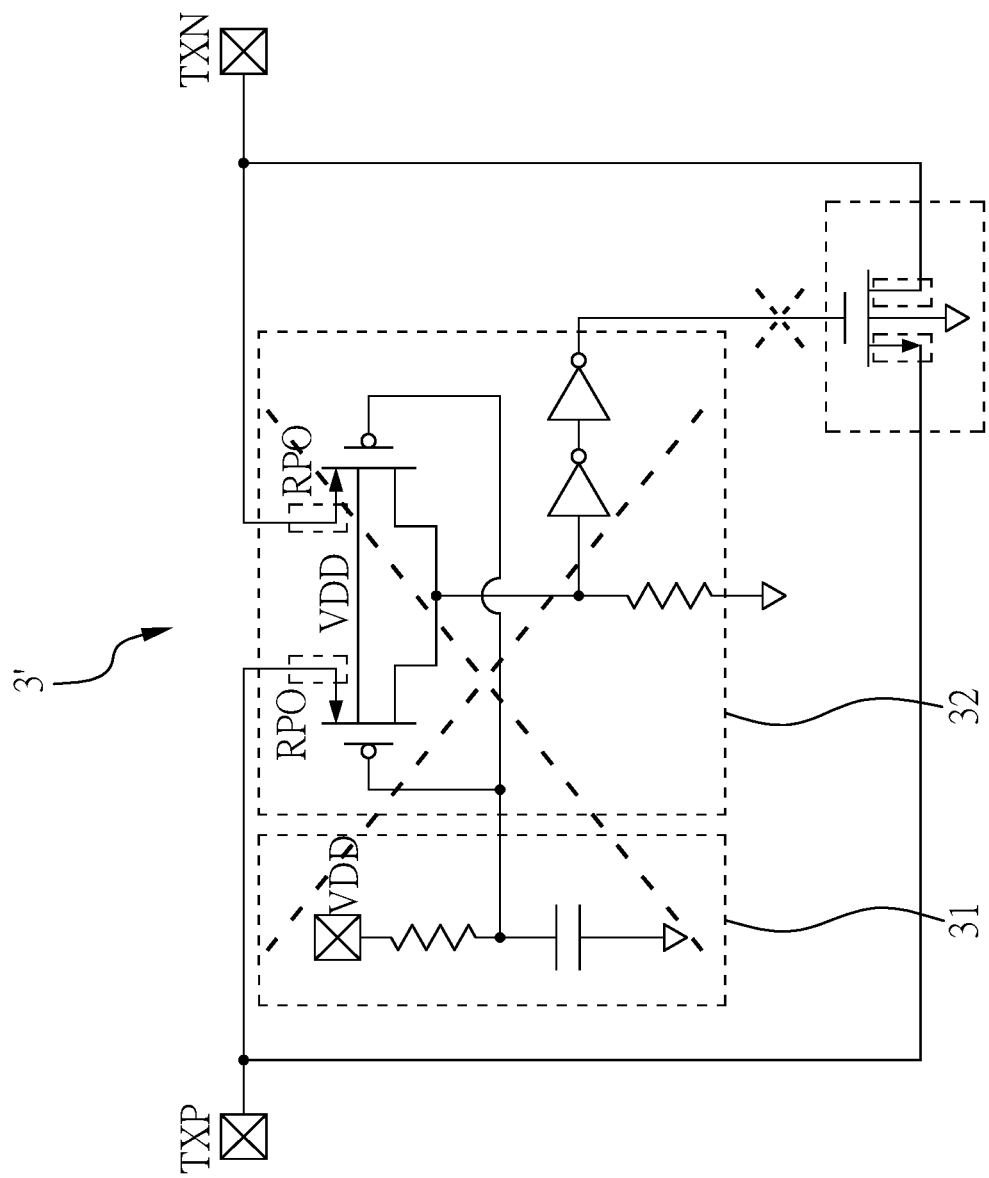
FIG. 15 shows an equivalent circuit diagram of the electronic device according to one embodiment of the present invention.

According to one advantage of the present invention, the total cost is reduced. For example, the cost for a board-level surge protection unit is saved, and the bonding cost for providing the board-level surge protection unit is also saved. FIG. 15 shows an equivalent circuit diagram of the electronic device 2' according to one embodiment of the present invention, wherein the external resistance 261 and the surge protector 262 have been removed (crosses are marked on the removed components).

Figure 16:
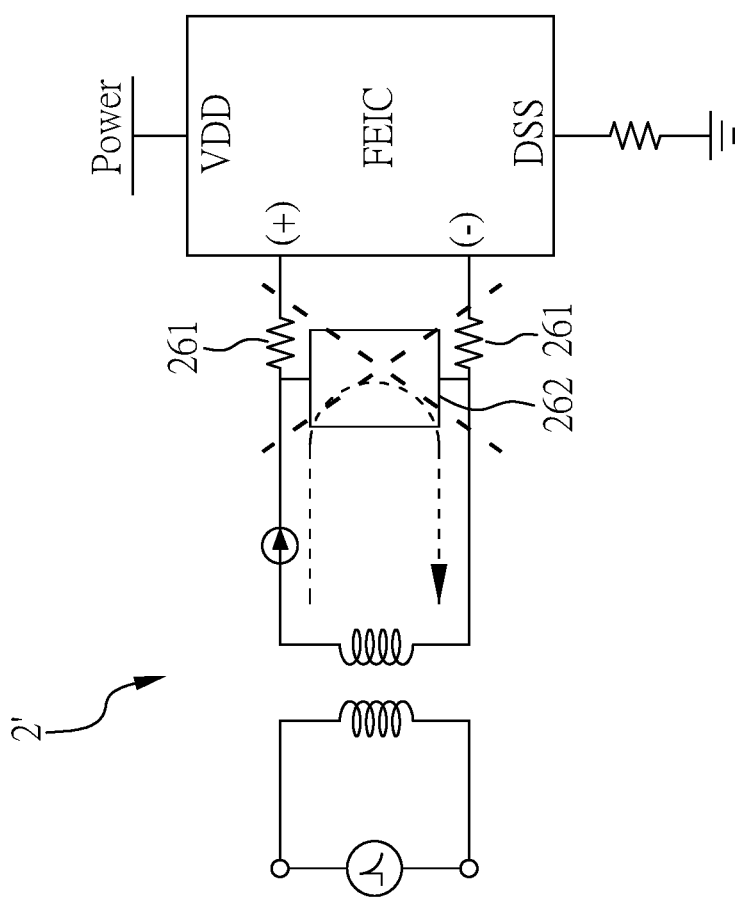
FIG. 16 shows a circuit diagram of the on-chip surge protection circuit according to one embodiment of the present invention.

According to another advantage of the present invention, the surge detector can be removed (or omitted), and/or the additional triggering circuit used to control the surge protector can be removed (or omitted), thereby reducing the area occupied by the surge protection circuit, and/or reducing the complexity of the surge protection circuit, thanks to the fact that, the present invention directly uses a natural (or inherent) signal in the system (chip) as the surge control signal. FIG. 16 shows a circuit diagram of the on-chip surge protection circuit 3' according to one embodiment of the present invention, wherein the bias unit 31, the surge detection unit 32, and the special control signal EN have been removed (crosses are marked on the removed components).

Finally, according to still another advantage of the present invention, an automatic self-protection mechanism to deal with a surge is realized in the chip, which is capable of drain extreme voltage energy away.

Although the present invention has been explained in relation to various embodiments, it is to be understood that many other possible modifications and variations may be made without departing from the spirit and scope of the present invention as hereinafter claimed.

What is claimed is:

1. An on-chip surge protection circuit, comprising:
   a low voltage rail;
   a negative transmitter differential output;
   a positive transmitter differential output; and
   a surge protection component, the surge protection component including:
   a first end connected to the negative transmitter differential output;
   a second end connected to the positive transmitter differential output; and
   a control end receiving a fixed voltage of the low voltage rail.

2. The on-chip surge protection circuit of claim 1, the surge protection component is integrated inside a chip.

3. The on-chip surge protection circuit of claim 1, wherein a surge induces a negative differential surge voltage at the negative transmitter differential output, and induces a positive differential surge voltage at the positive transmitter differential output; the surge protection component being configured to be turned on according to the negative differential surge voltage, the positive differential surge voltage, and the low voltage rail's voltage.

4. The on-chip surge protection circuit of claim 3, wherein the surge protection component is configured to be turned off when there is no surge or the surge disappears.

5. The on-chip surge protection circuit of claim 1, wherein the low voltage rail's voltage serves as a surge control signal for the surge protection component.

6. The on-chip surge protection circuit of claim 1, wherein the surge protection component forms a bypass path between the negative transmitter differential output and the positive transmitter differential output to drain surge current away.

7. The on-chip surge protection circuit of claim 6, wherein the bypass path is a bidirectional path for the surge current to follow from the negative transmitter differential output to the positive transmitter differential output, or to flow from the positive transmitter differential output to the negative transmitter differential output, according to a negative differential surge voltage and a positive differential surge voltage.

8. The on-chip surge protection circuit of claim 1, wherein the surge protection component is a bipolar junction transistor (BJT), a silicon controlled rectifier (SCR), a field oxide device (FOD), or a metal-oxide-semiconductor (MOS) field effect transistor.

9. The on-chip surge protection circuit of claim 1, wherein the surge protection component is a parasitic component.

10. The on-chip surge protection circuit of claim 1, wherein the surge protection component is formed of an oxide diffusion diode structure or a well diode structure.

11. The on-chip surge protection circuit of claim 1, further comprising:
a first pull-up component arranged between a high voltage rail and the negative transmitter differential output;
a second pull-up component arranged between the high voltage rail and the positive transmitter differential output;
a first pull-down component arranged between the negative transmitter differential output and the low voltage rail; and
a second pull-down component arranged between the positive transmitter differential output and the low voltage rail.

12. The on-chip surge protection circuit of claim 11, wherein the first pull-up component, the second pull-up component, the first pull-down component, and/or the second pull-down component is a diode, a silicon controlled rectifier, a bipolar junction transistor, or a metal-oxide-semiconductor field effect transistor.

13. The on-chip surge protection circuit of claim 11, wherein the first pull-up component, the second pull-up component, the first pull-down component, and/or the second pull-down component is formed by forming a p-well and an n-well in a deep n-well.

14. The on-chip surge protection circuit of claim 11, wherein the surge protection component is a parasitic component derived from the first pull-up component, the second pull-up component, the first pull-down component, and the second pull-down component.

15. The on-chip surge protection circuit of claim 1, wherein the on-chip surge protection circuit is configured to withstand a surge voltage of 0 to 4 kV under conditions of open circuit voltage wave 1.2 μs/50 μs, and short circuit current wave 8 μs/20 μs.

16. The on-chip surge protection circuit of claim 1, wherein the on-chip surge protection circuit is configured to withstand a surge voltage of 0 to 4 kV under conditions of open circuit voltage wave 10 μs/700 μs, and short circuit current wave 5 μs/320 μs.

17. An electronic device, comprising:
a primary-side transformer;
a secondary-side transformer coupled to the primary-side transformer; and
a chip connected to the secondary-side transformer, and including the on-chip surge protection circuit of claim 1.

18. The electronic device of claim 17, wherein the electronic device excludes any external resistance, and also excludes any external surge protector.

19. The electronic device of claim 17, wherein the electronic device is a circuit board or a digital subscriber line.

20. The on-chip surge protection circuit of claim 1, wherein the fixed voltage is ground.

* * * * *